US009555944B2

(12) United States Patent
Eom

(10) Patent No.: US 9,555,944 B2
(45) Date of Patent: Jan. 31, 2017

(54) ELECTRONIC CONTROL UNIT FOR VEHICLE

(71) Applicant: MANDO CORPORATION, Pyeongtaek-si (KR)

(72) Inventor: Seong Yeon Eom, Seongnam-si (KR)

(73) Assignee: MANDO CORPORATION, Gyeonggi-Do (KR)

(*) Notice: Subject to any disclaimer, the term of this patent is extended or adjusted under 35 U.S.C. 154(b) by 0 days.

(21) Appl. No.: 14/640,326

(22) Filed: Mar. 6, 2015

(65) Prior Publication Data
US 2015/0251835 A1 Sep. 10, 2015

(30) Foreign Application Priority Data

Mar. 7, 2014 (KR) ........................ 10-2014-0026998

(51) Int. Cl.
*H05K 5/06* (2006.01)
*B65D 81/02* (2006.01)
*B65D 85/38* (2006.01)
*B62D 5/04* (2006.01)

(52) U.S. Cl.
CPC ............. *B65D 81/02* (2013.01); *B62D 5/0406* (2013.01); *B65D 85/38* (2013.01); *H05K 5/063* (2013.01)

(58) Field of Classification Search
CPC ....... H05K 5/063; B62D 5/0406; B65D 85/38; B65D 81/02
USPC ....... 220/799, 797, 4.02, 806, 795; 174/563, 174/561, 560
See application file for complete search history.

(56) References Cited

U.S. PATENT DOCUMENTS 2,273,247 A * 2/1942 Barnby .............. B65D 43/0222
220/284
2005/0068750 A1* 3/2005 Origlia ................. H05K 5/0056
361/752

FOREIGN PATENT DOCUMENTS

KR 2003-0067920 8/2003

OTHER PUBLICATIONS

Office Action dated Feb. 2, 2015 for Korean Patent Application No. 10-2014-0026998.

* cited by examiner

*Primary Examiner* — Stephen Castellano
(74) *Attorney, Agent, or Firm* — Ladas & Parry, LLP

(57) ABSTRACT

The present invention relates to an electronic control unit for a vehicle. The electronic control unit for a vehicle can improve waterproof efficiency of a space between an upper case and a lower case in order to prevent damage to internal components, thereby improving steering stability.

14 Claims, 6 Drawing Sheets

ELECTRONIC CONTROL UNIT FOR VEHICLE

CROSS-REFERENCE TO RELATED APPLICATION

This application claims priority from and the benefit under 35 U.S.C. §119(a) of Korean Patent Application No. 10-2014-0026998, filed on Mar. 7, 2014, which is hereby incorporated by reference for all purposes as if fully set forth herein.

BACKGROUND OF THE INVENTION

1. Field of the Invention

The present invention relates to an electronic control unit for a vehicle, and more particularly to an electronic control unit for a vehicle that can improve the waterproof efficiency of a space between an upper case and a lower case to prevent damage to internal components, thereby improving steering stability.

2. Description of the Prior Art

FIG. 1 is a perspective view illustrating a steering apparatus for a vehicle according to the related art.

As illustrated in FIG. 1, the steering apparatus 100 for a vehicle according to the related art can perform a tilting or telescoping function while a tilt bracket is contracted or expanded radially, that is, in a direction perpendicular to a steering shaft 101 when a tilt lever is fastened or unfastened when a hollow inner tube 105 surrounding the steering shaft 101 is inserted into an outer tube 103.

The inner tube 105 has a hollow shape surrounding the steering shaft 101 and a lower mounting bracket 107 is coupled to a cowl bracket (not shown) coupled to a vehicle body by means of a tilt hinge tube 111, so that the lower mounting bracket 107 may be rotated about the tilt hinge tube 111 during a tilting operation, and the outer tube 103 may be slid axially along the inner tube 105 during a telescoping operation.

A mounting bracket 109 is coupled to an outer periphery of the outer tube 103, and an upper surface of the mounting bracket 109 is fixed to the body of the vehicle to fix the steering apparatus 100.

An electronic control unit 117 connected to a torque sensor and a gear housing 113, in which a reducer for assisting steering power using a driving force of a motor 115, is installed are coupled to one side of the steering apparatus 100.

However, in the steering apparatus for a vehicle according to the related art, the electronic control unit 117 includes a housing 119 for protecting internal components, and a cover coupled to the housing 119, and accordingly, moisture may permeate between the housing 119 and the cover, damaging various components in the electronic control unit, and thus making it impossible to secure steering stability.

SUMMARY OF THE INVENTION

The present invention has been made in an effort to solve the above-mentioned problems, and provides an electronic control unit for a vehicle that can improve waterproof efficiency of a space between an upper case and a lower case in order to prevent damage to internal components, thereby improving steering stability.

The objects of the present invention are not limited thereto, and other unmentioned objects will be clearly understood by those skilled in the art.

In accordance with an aspect of the present invention, there is provided an electronic control unit for a vehicle, including: a protruding coupling part protruding from one side of a coupling part where an upper case and a lower case are coupled to each other while contacting each other and formed of a resilient material; and a waterproofing coupling part inserted into and coupled to a coupling recess formed at an opposite side of the coupling part and having a protruding coupling part insertion recess such that the protruding coupling part is inserted into and fixed to the protruding coupling part insertion recess.

According to an embodiment of the present invention, steering stability can be improved by improving waterproof efficiency between an upper case and a lower case and, accordingly, preventing damage to internal components.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

Hereinafter, some embodiments of the present invention will be described in detail with reference to the exemplary drawings. In the following description, it should be appreciated that when one component is described as being "connected," "coupled" or "joined" to another component, a third component may be "connected," "coupled," and "joined" between the first and second components, although the first component may be directly connected, coupled or joined to the second component.

Figure 1:
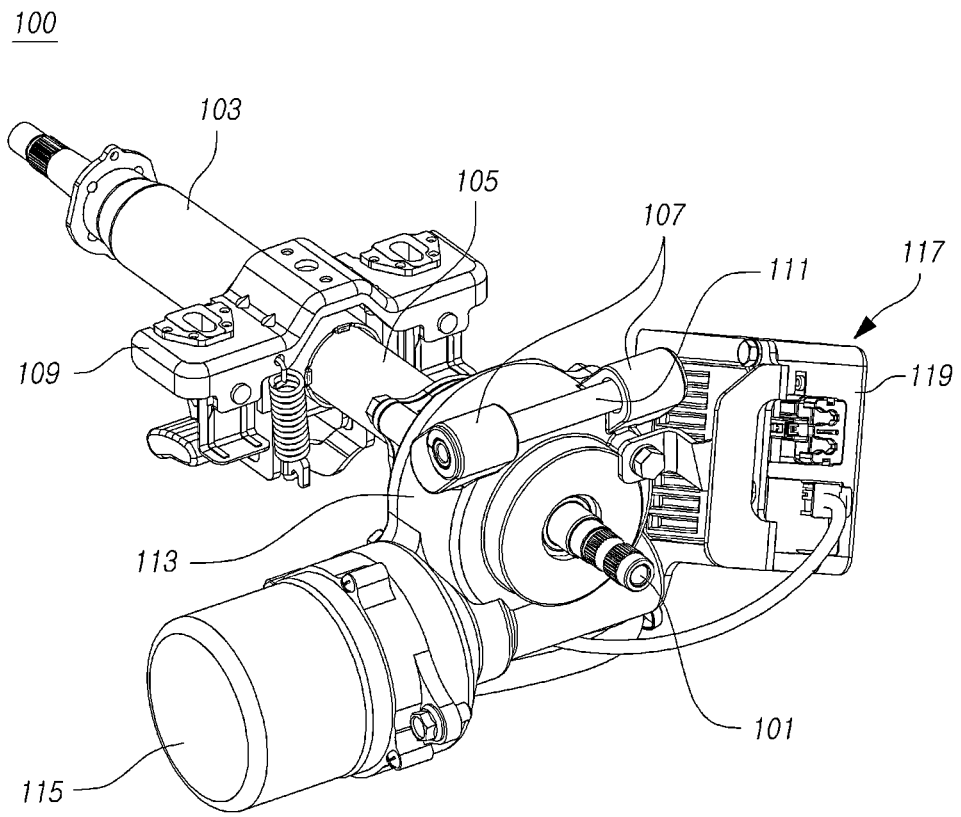
FIG. 1 is a perspective view illustrating a steering apparatus for a vehicle according to the related art.
Figure 2:
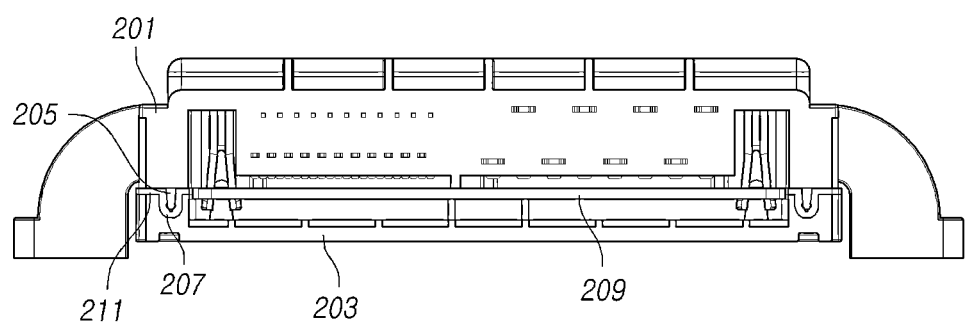
FIG. 2 is a front view of a part of an electronic control unit for a vehicle according to an embodiment of the present invention.
Figure 3:
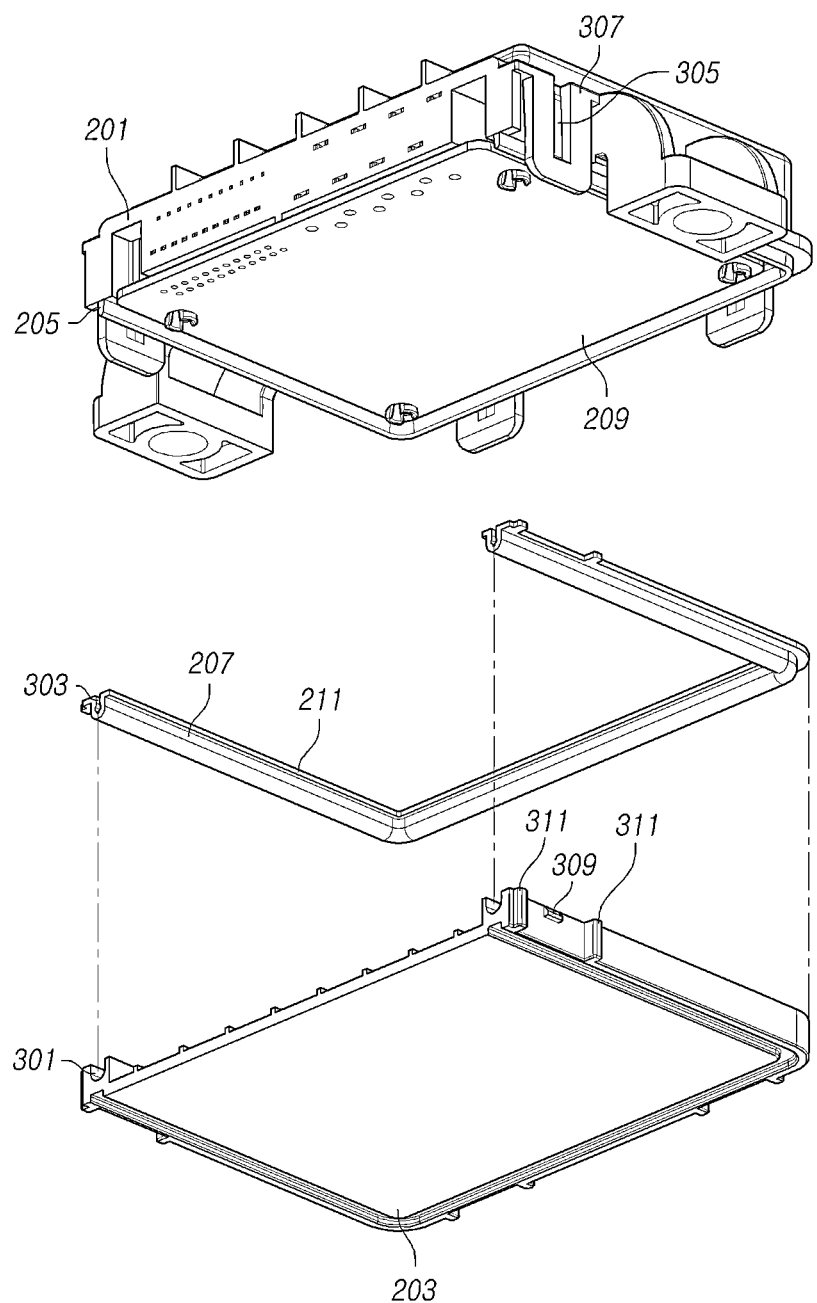
FIG. 3 is an exploded perspective view of FIG. 2.
Figure 4:
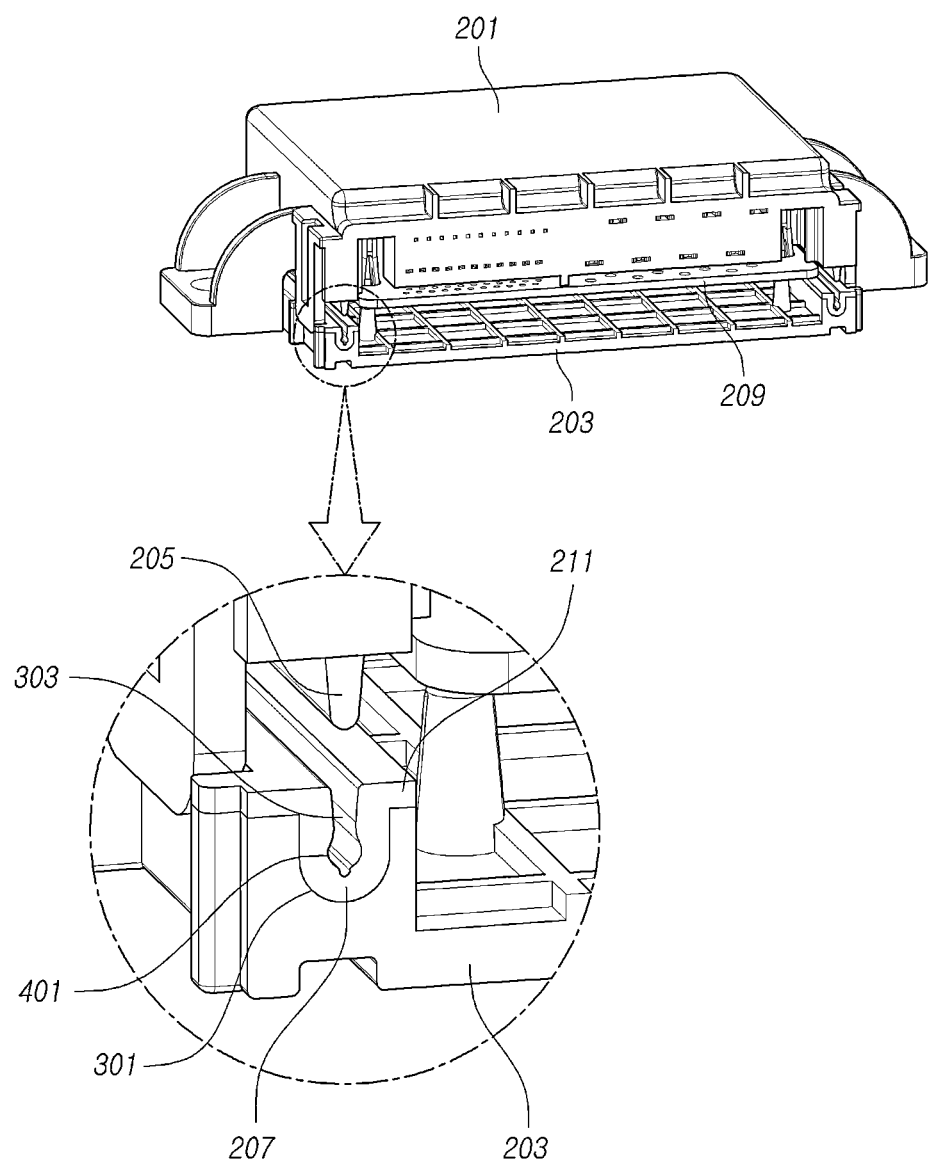
FIG. 4 is a partially enlarged perspective view of an electronic control unit for a vehicle according to an embodiment of the present invention.
Figure 5:
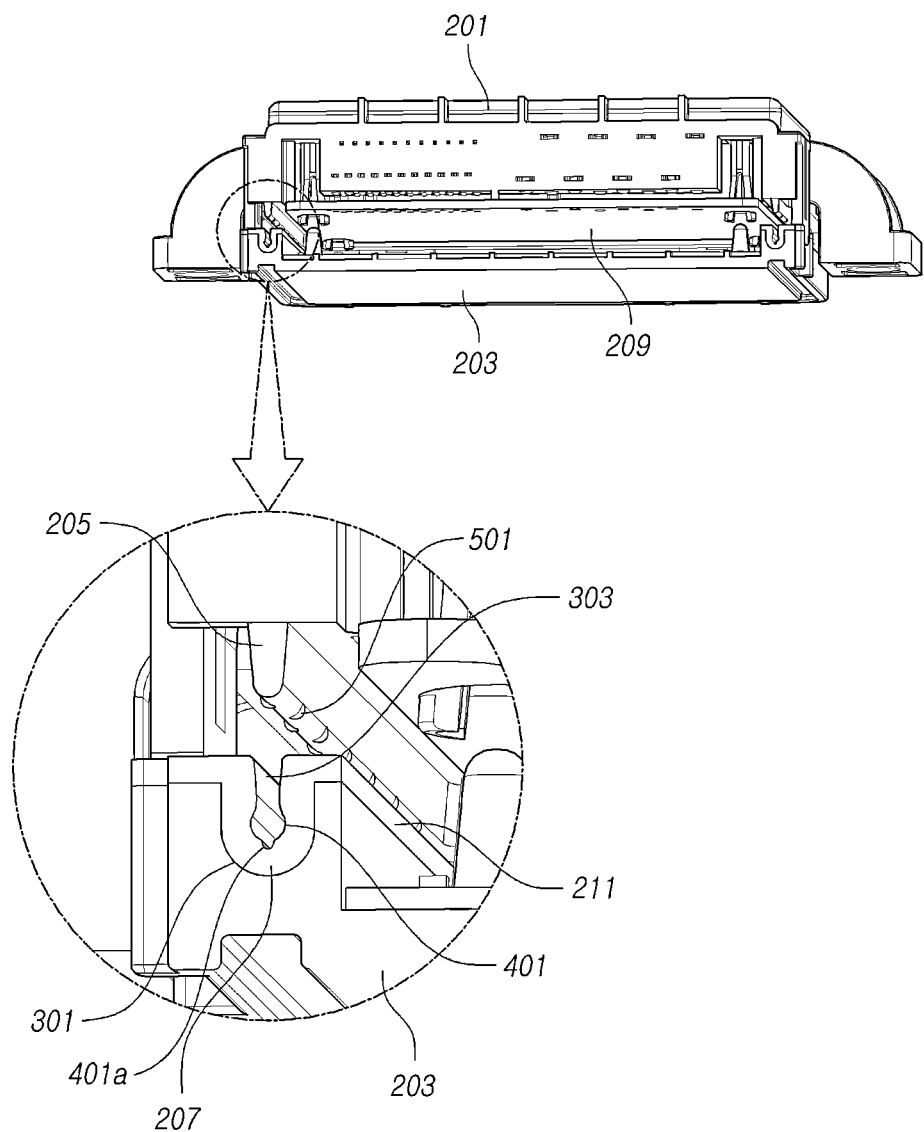
FIG. 5 is a partially enlarged perspective view of an electronic control unit for a vehicle according to another embodiment of the present invention.
Figure 6:
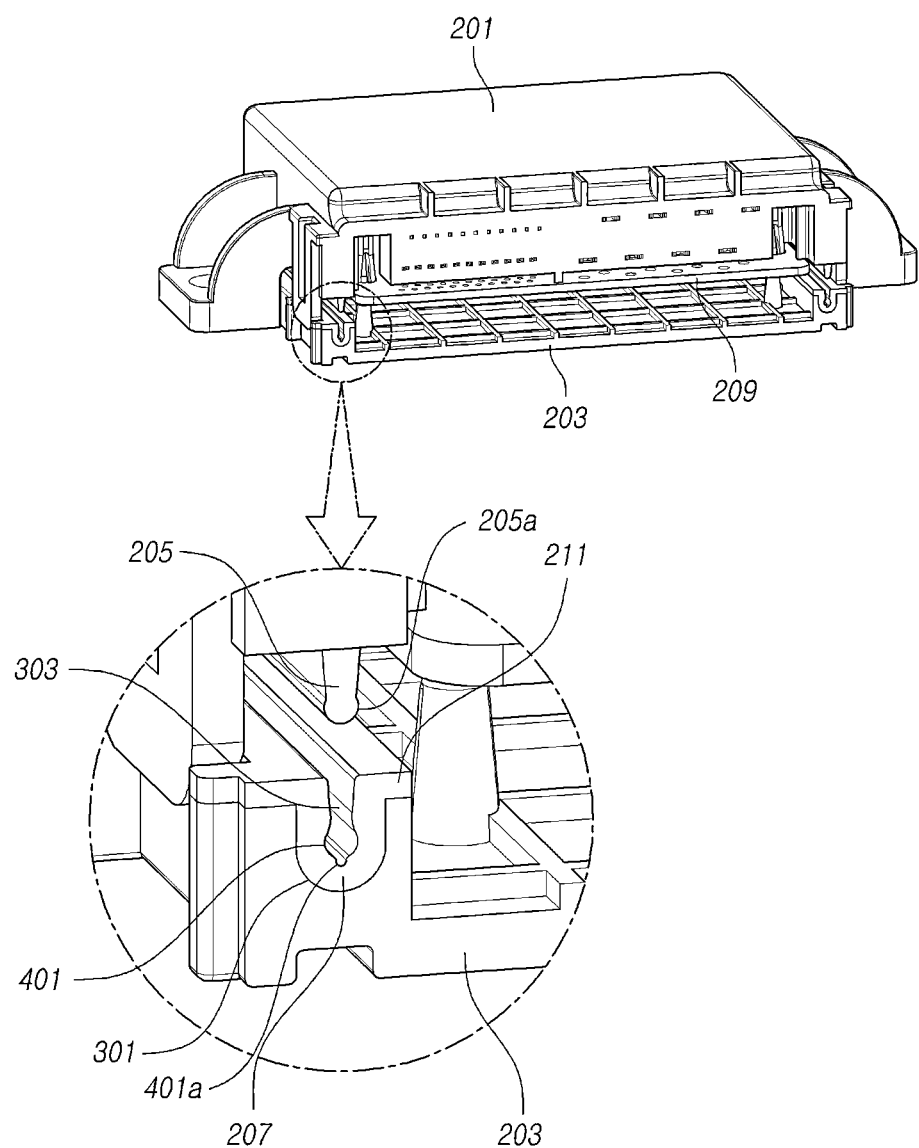
FIG. 6 is a partially enlarged perspective view of an electronic control unit for a vehicle according to another embodiment of the present invention.

FIG. 2 is a front view of a part of an electronic control unit for a vehicle according to an embodiment of the present invention. FIG. 3 is an exploded perspective view of FIG. 2. FIG. 4 is a partially enlarged perspective view of an electronic control unit for a vehicle according to an embodiment of the present invention. FIG. 5 is a partially enlarged perspective view of an electronic control unit for a vehicle according to another embodiment of the present invention. FIG. 6 is a partially enlarged perspective view of an electronic control unit for a vehicle according to another embodiment of the present invention.

As illustrated in the drawings, an electronic control unit for a vehicle according to an embodiment of the present invention includes: a protruding coupling part 205 protruding from one side of a coupling part where an upper case 201 and a lower case 203 are coupled to each other while contacting each other and formed of a resilient material; and a waterproofing coupling part 207 inserted into and coupled to a coupling recess 301 formed at an opposite side of the coupling part where the upper case 201 and the lower case 203 are coupled to each other while contacting each other and having a protruding coupling part insertion recess 303 such that the protruding coupling part 205 is inserted into and fixed to the protruding coupling part insertion recess 303.

Hereinafter, an example of forming an external appearance of an Electronic Control Unit (ECU) including an upper case 201, a lower case 203, and a substrate 209 will be described, but it is apparent that the present invention also may be applied to a case structure that surrounds various components.

Furthermore, an example in which the protruding coupling part 205 is formed in the upper case 201 and the waterproofing coupling part 207 is formed in the lower case 203 will be described hereinafter, but it is apparent that, in contrast, the protruding coupling part 205 may be formed in the lower case 203 and the waterproofing coupling part 207 may be formed in the upper case 201.

The upper case 201 and the lower case 203 constitute a case that surrounds the substrate 209 and the like.

Because a guide coupling part 307 having a coupling hole 305 is formed at a central portion of the upper case 201 and a coupling boss 309 inserted into the coupling hole 305 of the guide coupling part 307 when the upper case 201 is coupled to the lower case 203 is formed in the lower case, the upper case 201 and the lower case 203 can be simply attached to or detached from each other.

A guide part 311 for guiding slide of the guide coupling part 307 when the upper case 201 and the lower case 203 are coupled to each other and protecting the guide coupling part 307 from an external impact protrudes from the lower case 203.

Of course, the numbers of the guide coupling part 307, the coupling boss 309, and the guide part 311 may be plural.

The protruding coupling part 205 protrudes from the upper case 201 of the coupling part where the upper case 201 and the lower case 203 are coupled while contacting each other.

That is, the protruding coupling part 205 may be continuously formed along a periphery of a bottom surface of the upper case 201.

Meanwhile, because the protruding coupling part 205 may have a wedge shape of which a width decreases as it goes towards a lower portion of the protruding coupling part 205, that is, an end of the protruding coupling part 205 inserted into the protruding coupling part insertion recess 303, it is inserted into the protruding coupling part insertion recess 303 of the waterproofing coupling part 207, which will be described below, to be easily fixed.

The protruding coupling part 205 is formed of a resilient material such as rubber.

The resilient protruding coupling part 205 may be formed in the upper case 201 through an injection-molding or dual injection-molding process.

As illustrated in FIG. 5, according to another embodiment of the present invention, a plurality of bosses 501 are formed at a lower portion of the protruding coupling part 205 in a lengthwise direction of the protruding coupling part 205 to be spaced apart from each other.

The bosses 501 exhausts gas (air) in a space between the protruding coupling part 205 and the waterproofing coupling part 207 to the outside when the protruding coupling part 205 and the waterproofing coupling part 207 are coupled to each other in order to minimize pressure generated when the protruding coupling part 205 and the waterproofing coupling part 207 are assembled so that assembly efficiency can be improved.

That is, because a boss 501 is additionally formed at a lower portion of the protruding coupling part 205, a marginal space is formed between a lower end of the protruding coupling part 205 and the protruding coupling part insertion recess 303 of the waterproofing coupling part 207 such that gas (air) can be exhausted through the marginal space, so that the protruding coupling part 205 and the waterproofing coupling part 207 can be assembled more easily.

Meanwhile, the bosses 501 may be formed at opposite sides of a lower portion of the protruding coupling part 205, and the boss 501 formed at one side of the lower portion of the protruding coupling part 205 and the boss 501 formed at an opposite side of the lower portion of the protruding coupling part 205 may be disposed in a zigzag pattern.

Of course, if the bosses 501 formed at opposite sides of the lower portion of the protruding coupling part 205 are disposed in a zigzag pattern, the space between the lower portion of the protruding coupling part 205 and the protruding coupling part insertion recess 303 can be further secured.

Next, the waterproofing coupling part 207 is inserted into and coupled to the coupling recess 301 formed in the lower case 203 of the coupling part where the upper case 201 and the lower case 203 are coupled to each other while contacting each other.

A protruding coupling part insertion recess 303 is formed in the waterproofing coupling part 207 such that the protruding coupling part 205 may be inserted into and fixed to the protruding coupling part insertion recess 303.

For example, the waterproofing coupling part 207 may be formed of a resilient material such as rubber.

Wings 211 extending to opposite sides are formed at an upper end of the waterproofing coupling part 207, and accordingly, a waterproofing performance of the coupling part of the upper case 201 and the lower case 203 can be improved.

An expanded space 401 for expanding a space between facing inner surfaces of the protruding coupling part insertion recess 303 of the waterproofing coupling part 207 and the protruding coupling part 205 is formed at an opposite side of an opening (an entrance of the protruding coupling part insertion recess 303 of the waterproofing coupling part 207 through which the protruding coupling part 205 is inserted) of the protruding coupling part insertion recess 303 of the waterproofing coupling part 207.

In this way, because the expanded space 401 is formed in the protruding coupling part insertion recess 303, the air pressure can be dispersed when the protruding coupling part 205 is introduced into the protruding coupling part insertion recess 303, so that assembly efficiency can be improved, and a space for deforming the waterproofing coupling part 207 can be secured.

That is, when the protruding coupling part 205 is introduced into the protruding coupling part insertion recess 303, a press force for inserting the protruding coupling part 205 into the protruding coupling part insertion recess 303 may increase due to a pressure of internal air, and as described above, if the expanded space 401 is formed in the protruding coupling part insertion recess 303, a pressure due to the internal air is dispersed, so that the pressure force can be prevented from increasing, and accordingly, assembly efficiency can be improved.

A curved ball portion 205a protruding from an end of the protruding coupling part 205, which is inserted into the protruding insertion recess 303, to the outside may be provided in the protruding coupling part 205, and if the ball portion 205a is formed at the end of the protruding coupling part 205 in this way, the ball portion 205a is inserted into the protruding coupling part insertion recess 303 while expanding the opening of the protruding coupling part insertion recess 303 and is positioned in the expanded space 401, so that coupling force can be improved by preventing the protruding coupling part 205 from being separated reversely.

Furthermore, a stress dispersing recess 401a is formed on the bottom surface of the expanded space 401, and when the protruding coupling part 205 is inserted, a stress concentrated on the bottom surface of the expanded space 401, that is, a stress concentrated on a central portion of the bottom surface of the expanded space 401 is distributed to a periphery of the stress dispersing recess 401a.

Accordingly, because stress can be prevented from being concentrated on the bottom surface of the expanded space 401, durability of the waterproofing coupling part 207 can be improved and the life span of the components can be extended.

As described above, according to the embodiment of the present invention, because damage to the internal components can be prevented by improving waterproof efficiency between the upper case and the lower case, steering stability can be improved.

Even if it was described above that all of the components of an embodiment of the present invention are coupled as a single unit or coupled to be operated as a single unit, the present invention is not necessarily limited to such an embodiment. The scope of the present invention shall be construed on the basis of the accompanying claims in such a manner that all of the technical ideas included within the scope equivalent to the claims belong to the present invention.

What is claimed is:

1. An electronic control unit for a vehicle, comprising:
a protruding coupling part protruding from one side of a coupling part where an upper case and a lower case are coupled to each other while contacting each other and formed of a resilient material; and
a waterproofing coupling part inserted into and coupled to a coupling recess formed at an opposite side of the coupling part and having a protruding coupling part insertion recess such that the protruding coupling part is inserted into and fixed to the protruding coupling part insertion recess, wherein wings are formed at upper ends of the waterproofing coupling part and extend to both sides.

2. The electronic control unit of claim 1, wherein an expanded space for expanding a space between facing inner surfaces of the protruding coupling part insertion recess of the waterproofing coupling part and the protruding coupling part is formed at an opposite side of an opening of the protruding coupling part insertion recess of the waterproofing coupling part.

3. The electronic control unit of claim 2, wherein a stress dispersing recess for dispersing a stress concentrated on the bottom surface of the expanded space when the protruding coupling part is inserted is formed on the bottom surface of the expanded space.

4. The electronic control unit of claim 1, wherein a plurality of bosses are formed at a lower portion of the protruding coupling part to be spaced apart from each other such that gas in a space between the protruding coupling part and the waterproofing coupling part is exhausted to the outside when the protruding coupling part and the waterproofing coupling part are coupled to each other.

5. The electronic control unit of claim 4, wherein the bosses are formed at opposite sides of a lower portion of the protruding coupling part.

6. The electronic control unit of claim 5, wherein the boss formed at one side of the lower portion of the protruding coupling part and the boss formed at an opposite side of the lower portion of the protruding coupling part are disposed in a staggered configuration.

7. The electronic control unit of claim 1, wherein the protruding coupling part has a wedge shape of which a width decreases as it goes towards an end of the protruding coupling part inserted into the protruding coupling part insertion recess.

8. The electronic control unit of claim 1, wherein a curved ball portion protruding from an end of the protruding coupling part, which is inserted into the protruding insertion recess, to the outside is provided in the protruding coupling part.

9. An electronic control unit for a vehicle, comprising:
a protruding coupling part protruding from one side of a coupling part where an upper case and a lower case are coupled to each other while contacting each other and formed of a resilient material; and
a waterproofing coupling part inserted into and coupled to a coupling recess formed at an opposite side of the coupling part and having a protruding coupling part insertion recess such that the protruding coupling part is inserted into and fixed to the protruding coupling part insertion recess;
wherein a plurality of bosses are formed at a lower portion of the protruding coupling part to be spaced apart from each other such that gas in a space between the protruding coupling part and the waterproofing coupling part is exhausted to the outside when the protruding coupling part and the waterproofing coupling part are coupled to each other, and
wherein the bosses are formed at opposite sides of a lower portion of the protruding coupling part.

10. The electronic control unit of claim 9, wherein an expanded space for expanding a space between facing inner surfaces of the protruding coupling part insertion recess of the waterproofing coupling part and the protruding coupling part is formed at an opposite side of an opening of the protruding coupling part insertion recess of the waterproofing coupling part.

11. The electronic control unit of claim 10, wherein a stress dispersing recess for dispersing a stress concentrated on the bottom surface of the expanded space when the protruding coupling part is inserted is formed on the bottom surface of the expanded space.

12. The electronic control unit of claim 9, wherein the boss formed at one side of the lower portion of the protruding coupling part and the boss formed at an opposite side of the lower portion of the protruding coupling part are disposed in a staggered configuration.

13. The electronic control unit of claim 9, wherein the protruding coupling part has a wedge shape of which a width decreases as it goes towards an end of the protruding coupling part inserted into the protruding coupling part insertion recess.

14. The electronic control unit of claim 9, wherein a curved ball portion protruding from an end of the protruding coupling part, which is inserted into the protruding insertion recess, to the outside is provided in the protruding coupling part.

* * * * *